United States Patent [19]
Darekar et al.

[11] Patent Number: 5,493,775
[45] Date of Patent: Feb. 27, 1996

[54] PRESSURE CONTACT OPEN-CIRCUIT DETECTOR

[75] Inventors: Vijay S. Darekar, Endwell; Charles G. Woychik, Vestal, both of N.Y.

[73] Assignee: International Business Machines Corporation, Armonk, N.Y.

[21] Appl. No.: 185,602

[22] Filed: Jan. 21, 1994

[51] Int. Cl.$^6$ ............................... H05K 3/34; B23K 1/06
[52] U.S. Cl. ................. 29/840; 29/407.07; 156/64; 228/1.1; 228/110.1
[58] Field of Search ...................... 29/840, 407; 228/1.1, 228/110, 110.1; 156/64

[56] References Cited

U.S. PATENT DOCUMENTS

| | | |
|---|---|---|
| 3,713,127 | 1/1973 | Keledy et al. . |
| 3,919,883 | 11/1975 | Nakamura et al. . |
| 3,930,405 | 1/1976. | Renken, Jr. . |
| 4,024,522 | 5/1977 | Clark et al. .................... 228/1.1 X |
| 4,188,830 | 2/1980 | Mason et al. . |
| 4,341,574 | 7/1982 | Landes ............................ 228/1.1 X |
| 4,386,526 | 6/1983 | Roeder . |
| 4,535,629 | 8/1985 | Prine . |
| 4,606,490 | 8/1986 | Chan et al. ..................... 228/1.1 X |
| 4,918,616 | 4/1990 | Yoshimura et al. . |
| 4,918,993 | 4/1990 | Hughson . |
| 4,922,754 | 5/1990 | Horne et al. . |
| 5,002,217 | 3/1991 | Tani et al. ...................... 228/1.1 X |
| 5,010,503 | 4/1991 | Paton et al. . |
| 5,115,681 | 5/1992 | Bouheraoua et al. . |
| 5,213,249 | 5/1993 | Long et al. ..................... 228/1.1 X |
| 5,383,270 | 1/1995 | Iwatsuka et al. ................. 29/840 |

FOREIGN PATENT DOCUMENTS

| | | | |
|---|---|---|---|
| 274117 | 12/1989 | Germany ............................ 228/1.1 |
| 62-31134 | 2/1987 | Japan ............................... 228/110.1 |

*Primary Examiner*—Carl J. Arbes
*Attorney, Agent, or Firm*—Whitham, Curtis, Whitham & McGinn; Michael E. Belk

[57] ABSTRACT

A method and apparatus for non-destructively detecting pressure contact open types of solder connections transmits acoustic emissions through an electronic component and the carrier upon which the electronic component is mounted by one or more solder connections. Emissions which are transmitted through the solder connections and which will interact with acoustic emissions generated if pressure contact opens are present are analyzed by comparison with the signal which is used to cause emissions to detect the presence of pressure contact opens by comparison of one or more of harmonics, energy, count, voltage, duration, rise time and time delay. A housing is preferably used to position a pair of transducers at respective locations which have solder connections topologically intervening therebetween. The testing process can thus be automated for screening assembled devices for the presence of pressure contact opens.

22 Claims, 2 Drawing Sheets

PRESSURE CONTACT OPEN-CIRCUIT DETECTOR

BACKGROUND OF THE INVENTION

1. Field of the Invention

The present invention generally relates to quality inspection systems including automated and non-destructive quality inspection systems and, more particularly, to the detection of improperly formed solder connections in electronic devices.

2. Description of the Prior Art

The use of semiconductor devices and integrated circuits has become almost universal in electronic devices of many diverse types. In particular, at the present time, it is common to mount integrated circuits and other electronic components on circuit boards or within packages or modules by solder connections which form both mechanical supports for and electrical connections to such devices. While solder joints generally perform both of these functions with relatively high reliability, structural support can often be achieved while electrical continuity is not. In such a case, discovery of the improperly formed solder connection is often difficult to locate and repair. For example, so-called "cold solder joints" have required extensive testing and trouble-shooting to repair since earliest uses of printed circuit boards. However, at the present state of the art, a chip may be mounted to a lead frame, the lead frame, in turn connected to a module, the module connected to a board, etc. and an improperly formed solder joint can occur at any level of a hierarchy of structures which may be employed.

While techniques of increasing the reliability of solder connection formation have become highly developed in recent years, the miniaturization of electronic circuitry has made the detection of improperly formed solder joints much more difficult. Increased functionality has greatly multiplied the number of connections made in a single device, board or module which renders testing of each connection impractical if not impossible. At the same time, the number of connections to each chip require geometries which complicate other testing or inspection procedures. For example, some integrated circuit chips are attached to a lamina or laminated carrier of a so-called multi-layer module by forming solder connections between congruent arrays of pads on the respective surfaces thereof. Thereafter, the chip, itself, prevents visual inspection of the solder connections and complicates use of any other known inspection technique.

Further, the geometries of connections themselves may defeat some testing and/or inspection procedures. For example, in so-called quad flat pack (QFP) integrated circuit package structures, connection leads extend laterally from the four sides of the package to overlap other conductors which generally extend inwardly toward the location at which the integrated circuit is to be mounted. The overlapping portions of these respective conductors are then soldered by flowing solder around and between the overlapped portions of the connection leads.

In such a case, the number of connections made will provide a good structural support even if a substantial number provide no electrical continuity or even mechanical contact. Conversely, since overlapped portions of connection leads may be held in contact, electrical continuity may exist even where a solder connection is improperly formed and which may open when the device, board or module is placed in service. Such a flaw is generally referred to as a "pressure contact open" which may be regarded as a solder connection similar to a cold solder joint where solder is present but does not form a continuous connection between the soldered elements (e.g. having a crack or inclusion) due to insufficient temperature, dewetting, loss of flux, contaminated leads or pads, separation or noncoplanarity of leads and the like but where some degree of electrical continuity remains due to compression applied in some mechanical manner to the connection. Known techniques for detection of subsurface flaws such as ultrasonic echo, x-ray radiography and even electrical continuity testing cannot detect such a pressure contact open since there is no gap between the connection leads when the joint is under pressure and electrical continuity is generally present. Additionally, in such a structure, the act of contacting a portion of the circuitry with a test probe may cause electrical continuity where it would not otherwise be present due to a bent connection lead, lead frame warpage, cold solder, inclusions of flux or contamination and the like.

Acoustic emission testing of structures is also generally known and is an important technique in metallurgical research and testing. Acoustic emission testing is, perhaps, the technique of choice for monitoring the growth of a defect in a stressed body of material, usually in large structures such as cranes, pipelines, bridges and nuclear reactors and the like which have some particularly critical structural components. Such techniques however, are often complicated by the fact that multiple acoustic sensors are required for triangulation to discover the location of the defect or defects. U.S. Pat. No. 5,010,503 to Paton et al. is exemplary of a multi-channel triangulation system and is principally directed to reduction of the amount of data which must be processed in order to locate a defect. However, for all its complexity, this technique of acoustic emission testing requires stressing of the material being tested to stimulate propagation of the crack or other defect (which is inappropriate to electronic circuit testing) and is also not effective or reliable to detect pressure contact opens since there is no gap in a pressure contact open and no further propagation of a pressure contact open is likely (e.g. the pressure contact open is fully formed during the soldering process), even under some level of stress.

Because of the lack of a reliable technique for detecting pressure contact opens, such improperly formed solder connections have become a leading cause of failures of electronic devices including digital data processors and computer systems which have been placed in service even though the frequency of production of pressure contact opens is generally quite low. The determination of a precise location of a pressure contact open is, accordingly, often of secondary importance to the detection of a device which is otherwise tested to be fully operational but which may fail after being placed in service. Further, current soldering techniques often provide for the concurrent reflowing of many solder preforms so that all connections to one or more chips may be simultaneously formed or reformed; reducing need to resolve the location of a pressure contact open.

Therefore, a need exists for a technique of screening electronic devices, boards and modules prior to shipment or assembly which is highly effective to detect the presence of pressure contact opens. This need is so great at the present time that optical inspection of individual connections by trained personnel to determine the shape of solder connections or in connection with individual probing of connections is currently the technique of choice in the manufacture of components of high reliability and quality. Even then, the number of solder connections is often so great that inspection of all solder connections in the component is a practical impossibility.

SUMMARY OF THE INVENTION

It is therefore an object of the present invention to provide an effective technique of screening assembled devices for integrity of solder connections and detecting improperly formed solder connections which form pressure contact opens.

It is a further object of this invention to provide for rapid and inexpensive screening of electronic components such as circuit boards, modules and other devices for the presence of pressure contact opens.

In order to accomplish these and other objects of the invention, methods of testing and fabrication of electronic devices are provided including the steps of applying a transducer arrangement at respective first and second locations on an electronic device having at least one solder joint intervening therebetween, causing vibration at one of the first and second locations, detecting vibration at another of the first and second locations and producing an electrical signal in accordance with the detected vibration, analyzing the electrical signal received in accordance with said detecting step in comparison with the vibration for at least one of harmonics, energy, voltage, duration, rise time and time delay, and determining integrity of the solder connection based on results of the analyzing step.

In accordance with another aspect of the invention, an electronic device having reduced likelihood of failure after being placed in service is provided which is manufactured by a process including the steps of soldering an electronic component to a carrier, and testing a connection made by the soldering step by the steps of applying a transducer arrangement at respective first and second locations on an electronic device having at least one solder joint intervening therebetween, causing vibration at one of the first and second locations, detecting vibration at another of the first and second locations and producing an electrical signal in accordance with the detected vibration, analyzing the electrical signal received in accordance with said detecting step in comparison with the vibration for at least one of harmonics, energy, voltage, duration, rise time and time delay, and determining integrity of the solder connection based on results of the analyzing step.

In accordance with a further aspect of the invention, an apparatus for testing an electronic device is provided including a calibrator for providing a periodic first electrical signal having a time-varying amplitude envelope, a first transducer connected to receive the first electrical signal for producing vibration, a second transducer for detecting vibration and producing a second electrical signal in response thereto, and a comparison arrangement for comparing the first electrical signal and the second electrical signal with respect to at least one of harmonics, energy, voltage, duration, rise time and time delay.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
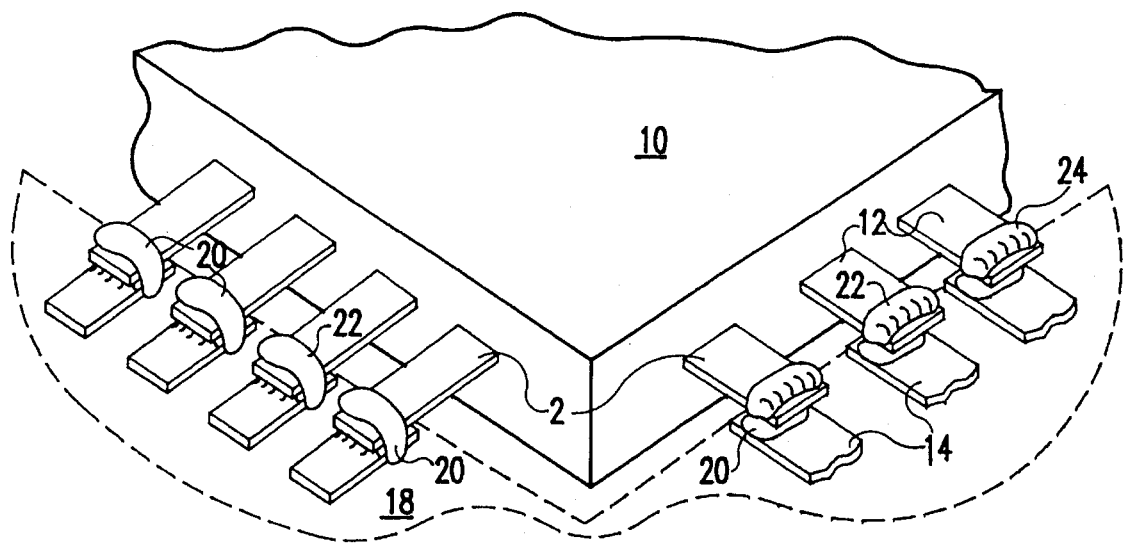
FIGS. 1 and 2 illustrate the nature and a principal failure modes of a pressure contact open.

Referring now to the drawings, and more particularly to FIG. 1, there is shown a portion of a so-called quad flat pack type of electronic chip package 10 together with connection leads 12 by which it is to be connected to other structure by soldering to leads or pad surfaces 14, which may be formed on the surface of a board or module lamina 18 (depicted as a dashed line), cantilevered therefrom or otherwise provided. As mentioned above, this type of package generally has connection leads 12 which extend laterally from all four sides of the rectangular body 16 of the package. These leads 12 overlap portions of the leads or pads 14 to form a so-called lap joint and solder is flowed between and around the surfaces of the connections which are overlapped in order to form a solder connection. It is to be understood, however, that the invention is not to be considered as limited to this particular type of joint structure but is, in fact, applicable with high reliability to detect pressure contact opens in all types of joint structures, whether at the lead frame, component, module, board or other level of a structural hierarchy such as that alluded to above. (For clarity, hereinafter, the invention will be described in terms of an electronic component and a "carrier" to which the electronic component is attached by one or more solder connections. However, it is to be understood that the invention is, in principle, applicable to any level or group of levels of any structural hierarchy which may be employed in the fabrication of any electronic device, ranging from individual integrated circuit packages to devices which include digital data processors and complete digital computer systems.) The type of connection to a quad flat pack is exemplary of structures where solder should be flowed at least between opposing surfaces to correctly form the connection and is chosen here for purposes of description of the invention in the interest of clarity of illustration of both the connection and the principal failure mode of a pressure contact open.

In FIG. 1, reference numeral 20 indicates properly formed solder connections. Even when opens (e.g. 24, depicted as a flaw due to lead frame warpage) or pressure contact opens 22 are present, correctly formed solder joints will typically be numerous and distributed in location so as to provide good mechanical support for the package, regardless of the form of the package. The existence of good mechanical support for the package, in fact, increases the difficulty of locating pressure contact opens 22 and contributes to failure modes thereof in several ways.

First, the good mechanical support tends to maintain compression in a pressure contact open which causes electrical continuity that masks the presence of the improperly formed solder connection. Second, the formation of the leads as a relatively flat beam reduces the flexure in the plane of the package if inspection or testing is carried out with probes which contact the leads in a manner to flex them in the plane of the package. Third, if probes are used to contact the leads in such a way as to flex them in a direction perpendicular to the plane of the package, relatively greater ease of flexure may increase the likelihood that electrical continuity will be caused by the testing or inspection process where (e.g. at 24) it would not otherwise exist. Fourth, it should be noted that solder will be flowed on the leads 12 and 14 even when a pressure contact open is formed and the profile of the solder deposit, when viewed from a direction perpendicular to the plane of the package will closely resemble the profile of a properly formed solder connection. Fifth, a pressure contact open, when mechanically stressed, will flex differently from a properly formed solder joint: either reacting as a simple cantilever (e.g. a beam clamped at one end if there is no mechanical support formed by the solder connection) rather than as a beam clamped at both ends or by concentrating bending and shear forces in the solder connection if the solder connection is mechanically weak (e.g. caused by a flux inclusion), leading to fatigue and fracture of the solder.

This elastic or inelastic deformation of the connection leads in response to stress will, of course, be less in leads having properly formed solder joints and thus increase the stress on and or strain in improperly formed solder connections. Thus, as shown in the side view of FIG. 2, a stress placed on package 10 which would deflect it to position 10', which may, for example, be caused by an impact or strong acceleration or by contact with package 10, may be sufficient to cause inelastic deformation of lead 12 to the shape shown at 12' while only elastic deformation occurs in leads with properly formed solder joints. Thus originally good electrical conductivity of a pressure contact open 22 may be lost, causing a failure of a component after it is placed in service.

Figure 2:
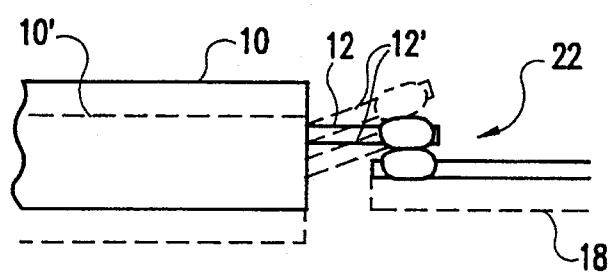

It has been discovered by the inventors that accelerations of a component which are substantially less than that depicted in FIG. 2 and which will not produce inelastic deformation of the connection leads will cause a detectable acoustic emission which is peculiar to pressure contact opens. Without wishing to be held to any particular theory or theories or particular mechanisms of this acoustic emission, the phenomenon can at least be visualized as being caused by rubbing together of the solder attached to each of leads 12 and 14 (or the leads themselves) or the opening and closing of a gap between the two parts of the pressure contact open as the compression in the pressure contact open is overcome by the acceleration.

If the acceleration is periodic, as in the case where the chip, device, module or board is vibrated, sympathetic relative motion such as rubbing or opening and closing of a gap causes acoustic emissions at harmonics and/or with shifted phase and time delay from the waveform by which the acceleration is caused. Therefore, the acoustic emissions from pressure contact opens will have certain characteristics which essentially constitute an acoustic signature which can be readily detected in accordance with the invention.

Figure 3:
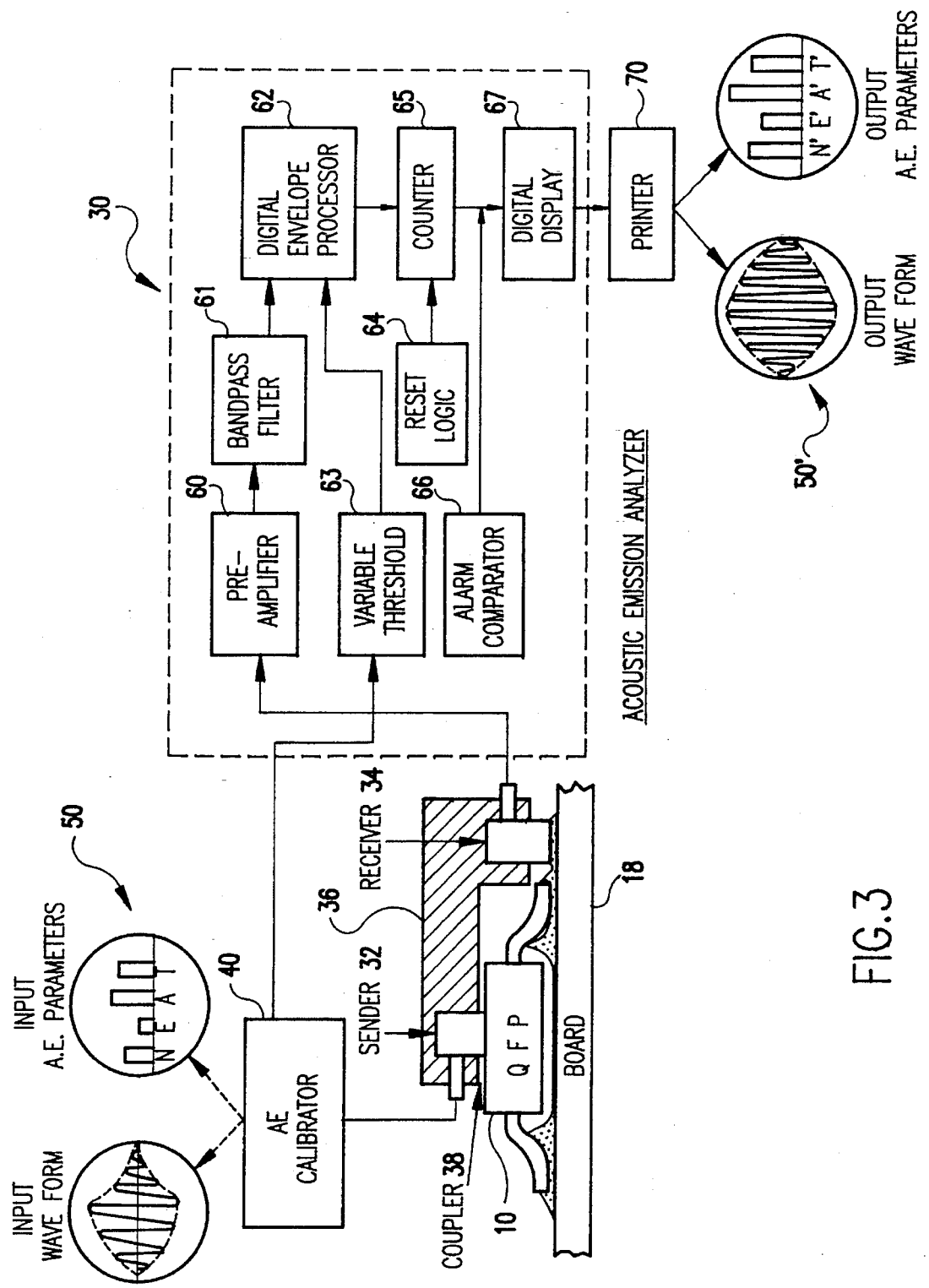
FIG. 3 is a schematic illustration of a preferred form of the screening system in accordance with the present invention.

Referring now to FIG. 3, an apparatus 30 for exploiting the acoustical emission phenomenon or the type which has been found, by the inventors, to occur in pressure contact opens will now be discussed. Two vibration transducers are preferred as a transmitter 32 and receiver 34, at first and second locations, respectively, which are spaced from each other in order to propagate an acoustic vibration across regions where solder connections exist (e.g. to attach an electronic component to a carrier). It may also be possible to use only a single transducer in the manner of a sonar arrangement in connection with a bifurcated probe to contact two locations on the device but such an arrangement is considered unnecessarily complicated for optimum detection of the acoustic emissions of interest and is unlikely to provide any convenience or relative advantage. Of course, more than two transducers could also be used involving any number of transmitters and receivers. However, a description of the preferred arrangement including two transducers as a transmitter and receiver will be sufficient to enable those skilled in the art to practice the invention.

It should be understood in this regard that known acoustic emissions detection systems often employ plural detection channels for purposes of triangulation and the obtaining of other information concerning the flaw, as in the U.S. Pat. No. 5,010,503, referred to above. The preferred form of the invention, in contrast, uses a simplified arrangement which features comparison of input and output signals in a single channel.

As a matter of convenience of use and uniformity of measurement conditions, the transmitting and receiving transducers, 32, 34, are preferably mounted in an L-shaped housing 36, preferably made of plastic to provide a unitary transducer probe head which will maintain a uniform distance between the transducers, maintain a consistent low degree of acoustic coupling between the transducers and also accommodate height differences between the surfaces of package 10 and board 18. This transducer probe head, so formed, can then be brought into contact with each package on a board, substrate or lamina and the board, substrate or lamina, itself, either manually or with automated test equipment (not shown), which can also provide uniformity of placement relative to the board. Regularity of positioning may be important in view of the fact that the vibration is propagated along plural paths of different lengths (e.g. through each lead) and interference effects are therefore possible.

Of course, while the transmitting or "sender" transducer 32 is shown contacting an integrated circuit package 10 and the receiver transducer 34 is shown contacting a board 18 to which the package 10 is attached through a plurality of solder connections, the direction of propagation of vibration is irrelevant to the practice of the invention and a direction of propagation which is the reverse of that shown may be preferable in some instances. Mechanical coupling of the transducers to the component and the board or other structure on which the component is mounted is preferably enhanced with a viscous coupling agent such as a non-conductive grease.

The transmitting or "sender" transducer is driven by a calibrator 40 which preferably includes a signal generator or is connected to receive a signal (preferably a periodic waveform having a time varying envelope) for driving the transducer with a periodic electrical signal. The frequency of the electrical signal is not particularly critical to the practice of the invention but a frequency close to the resonant frequency of connection leads 12 is believed to provide somewhat superior results and sensitivity but it must be recognized that the resonant frequency of lead 12 may be changed by the mass of solder which may be adhered to the lead and that the mass of solder is subject to substantial variation.

A periodically time-varying envelope for vibration amplitude applied to the device under test is preferred since the amount of compressional forces in a pressure contact open is also subject to wide variation and the amplitude at which acoustic emission will become pronounced will therefore vary with the amplitude of the vibration to which the package is subjected. This variation of acoustic emission with vibration amplitude is an important and highly characteristic of the acoustic signature of a pressure contact open. The maximum amplitude of the envelope should be limited to limit acceleration forces to levels below those which can cause inelastic deformation of leads 12 or other design limits on accelerations a device may withstand without damage. Inelastic deformation of leads 12, in particular, may compromise repairs to the device by reflowing of solder, as will be described below. However, it has been found that levels far below those which would cause such inelastic deformation are entirely adequate to reliable detection of pressure contact opens.

The receiver transducer 34 which serves to detect vibration through the solder connections as well as any acoustic emissions which may occur is coupled to an acoustic emission analyzer which may be, in some ways (such as the general type of display or data presentation provided), similar to signal spectrum analyzers which are commercially available. However, the parameters of acoustic emission which are of interest are different from those generally available in commercially available spectrum analyzer units. Specifically, the parameters of interest include counts of acoustic emission (e.g. at harmonics of the transmitted frequency signal) peaks, energy, peak or RMS voltage, amplitude, phase, duration, time delay and rise time. Preferably, the acoustic emission analyzer is also of a dual-channel type which can also receive, analyze and display the parameters of the transmitted signal waveform (as indicated at 50) concurrently and preferably registered with display (as indicated at 50') of the parameters of the signal from receiving transducer 34 for comparison therewith by an operator.

In accordance with the invention, the signal output by transducer 34 is first applied to a preamplifier 60 to increase signal level and provide a margin of noise immunity in the remainder of the analyzer. Some noise is also rejected by bandpass filter 61 which is preferably arranged to reject the fundamental frequency provided from calibrator 40 and frequencies at more than four to ten times the fundamental frequency since the first few harmonics are principally of interest and will have the greatest signal power of any frequencies which may be of interest. This filtered signal is then provided to a envelope processor 62 which is preferably a digital processor to reduce susceptibility to noise.

The digital envelope processor 62 determines the peak value of the filtered signal (RMS value can also be obtained and used) compared to a variable threshold signal provided from variable threshold element 63. The variable threshold is preferably made to follow the vibration amplitude envelope of the input waveform and essentially performs a type of normalizing (e.g. by applying a weight, subtraction or other processing) and comparison function since the amount of acoustic emission energy characteristic of a pressure contact open will vary non-linearly with acceleration (e.g. the amplitude of vibration produced). In contrast, harmonics and other frequencies produced by resonances of mechanical sub-systems which may be present will vary in a much more linear fashion but may "beat" or otherwise be superimposed on the signal in a way which will cause the threshold to be exceeded occasionally even when no pressure contact opens are present. On the other hand, the highly non-linear variance of acoustic emission with vibration amplitude will cause the variable threshold to be exceeded at high occurrence frequency when a pressure contact open is present.

It should be understood that similar effects can be observed in regard to the energy in the signal and the rise time and delay of the count behavior. Digital envelope processor 62 therefore preferably provides a separate channel for processing the signal for signal energy, peak or RMS voltage amplitude of each harmonic of interest and rise time or delay. In this latter regard, another important characteristic of the acoustic emission which is highly indicative of a pressure contact open is a tendency occur with a slight time delay in onset and cessation if the vibration amplitude is varied over time. Therefore, it is desirable to provide for processing of as many of these parameters with comparison against a variable threshold in each channel as is economically feasible although, in principle, pressure contact opens could be detected with some appreciable degree of effectiveness by the behavior of any one of these parameters.

In order to discriminate good devices from those including pressure contact opens, a count is kept of occurrences of a threshold being exceeded in each channel by a counter 65 and the count displayed in histogram form at 67. Counter 65 is periodically reset as well as when the transducing head is applied to a new package by reset logic 64. Therefore, a further threshold can be applied by alarm comparator 66 if a certain empirically determined difference in the number of counts is reached which is considered to be indicative of the presence of a pressure contact open. This alarm comparator thus provides for automatic rejection of devices which appear to contain pressure contact opens.

Display of the count in histogram or other graphic form also allows a trained operator (who, nevertheless, need not have any detailed knowledge of acoustic emission processes) to distinguish and reject other devices which have solder connections of questionable integrity and which may include pressure contact opens by the relative behavior of the counts (e.g. a time delay between the rapid increase of amplitude or energy channel counts and time delay channel counts). These rejected devices can then be subjected to the more labor-intensive inspection processes currently known in the art and the setting of the variable thresholds refined empirically, as necessary.

It should be noted that this process detects the specific chips or packages at which pressure contact opens exist which can be marked or otherwise identified for repair. As noted above, in preferred repair processes at the present state of the art, solder is reflowed at all connections of a particular package or chip at the same time and the reflow process can be carried out concurrently on plural chips. Therefore, there is no need to detect pressure contact opens with greater positional accuracy than is done in accordance with the invention.

In view of the foregoing, it is seen that the invention provides a method and apparatus for screening of assembled devices, boards or modules for integrity of solder connections which can be done rapidly and non-destructively and which does not require consideration of individual leads. The process can be carried out simply, quickly and inexpensively. While a trained operator can recognize some indications of the presence of pressure contact opens which may not cause an automatic rejection of a device, board or module, the training required involves only the ability to recognize certain characteristic behaviors of count in various combinations of signal processing channels and does not require detailed knowledge of acoustic emission phenomena. Logic circuitry, possibly implemented by a suitably programmed small general purpose computer could also be used to achieve the same purpose but it is considered that a trained operator is preferable, particularly in view of the relatively low level of training experience which is necessary to adequate performance. The required apparatus is quite simple, using only operational elements which are each well-understood in the art and can be combined in accordance with the foregoing disclosure at relatively low cost.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A method of testing a plurality of solder connections for the presence of at least one pressure contact open comprising the steps of applying a transducer means at respective first and second locations on an electronic device, said first and second locations having at least one solder joint intervening therebetween, causing vibration at one of said first and second locations using said transducer means, detecting vibration at another of said first and second locations using said transducer means, and producing an electrical signal in accordance with said detected vibration, analyzing said vibration received in accordance with said detecting step in comparison with said vibration caused by said step of causing vibration for at least one of harmonics, energy, voltage, duration, rise time and time delay, determining integrity of said solder connection based on results of said analyzing step.

2. A method as recited in claim 1, wherein said step of causing vibration includes the further step of varying the amplitude of said vibration in accordance with a time-varying envelope.

3. A method as recited in claim 1, wherein said step of causing vibration includes the further step of varying the amplitude of said vibration in accordance with a periodically varying envelope.

4. A method as recited in claim 1, wherein said step of applying a transducer means at respective first and second locations includes the further steps of applying a first transducer to an electronic circuit component and applying a second transducer to a structure to which said electronic component is attached by at least one solder connection.

5. A method as recited in claim 4, wherein said first and second transducers are included in a test probe head and said step of applying a transducer means includes the further step of applying said test probe head to said first and second locations.

6. A method as recited in claim 1, including the further step of band pass filtering of said electrical signal.

7. A method as recited in claim 1, including the further steps of establishing a comparison threshold in accordance with an amplitude of vibration caused by said step of causing vibration at one of said first and second locations, and counting the number of occurrences said comparison threshold is exceeded.

8. A method of manufacturing an electronic device including the steps of soldering an electronic component to a carrier, and testing a solder connection made by said soldering step, said testing step including the further steps of applying a transducer means to said electronic component and said carrier, causing vibration at one of said electronic component and said carrier using said transducer means, detecting vibration at another of said electronic component and said carrier using said transducer means, and producing an electrical signal in accordance with said detected vibration, analyzing said vibration received in accordance with said detecting step in comparison with said vibration caused by said step of causing vibration for at least one of harmonics, energy, voltage, duration, rise time and time delay, determining integrity of said solder connection based on results of said analyzing step.

9. A method as recited in claim 8, wherein said step of causing vibration includes the further step of varying the amplitude of said vibration in accordance with a time-varying envelope.

10. A method as recited in claim 8, wherein said step of causing vibration includes the further step of varying the amplitude of said vibration in accordance with a periodically varying envelope.

11. A method as recited in claim 8, wherein said step of applying a transducer means at respective first and second locations includes the further steps of applying a first transducer to said electronic circuit component and applying a second transducer to said carrier.

12. A method as recited in claim 11, wherein said first and second transducers are included in a test probe head and said step of applying a transducer means includes the further step of applying said test probe head to said first and second locations.

13. A method as recited in claim 8, including the further step of band pass filtering of said electrical signal.

14. A method as recited in claim 8, including the further steps of establishing a comparison threshold in accordance with an amplitude of vibration caused by said step of causing vibration at one of said first and second locations, and counting the number of occurrences said comparison threshold is exceeded.

15. A method as recited in claim 8 wherein said electronic device is a digital computer system and said electronic component is an integrated circuit therein, and including the further step of simultaneously reflowing solder at all connections of said integrated circuit to said carrier if a pressure contact open is detected by said detecting step.

16. Apparatus having a reduced likelihood of failure after being placed in service which is made by a process including the steps of soldering an electronic component to a carrier, and testing a connection made by said soldering step, said testing step including the further steps of applying a transducer means to said electronic component and said carrier, causing vibration at one of said electronic component and said carrier using said transducer means, detecting vibration at another of said electronic component and said carrier using said transducer means, and producing an electrical signal in accordance with said detected vibration, analyzing said vibration received in accordance with said detecting step in comparison with said vibration caused by said step of causing vibration for at least one of harmonics, energy, voltage, duration, rise time and time delay, determining integrity of said solder connection based on results of said analyzing step.

17. An electronic device as recited in claim 16, wherein said electronic device is a digital computer.

18. Apparatus for testing an electronic device including a calibrator means for providing a periodic first electrical signal having a time-varying amplitude envelope, a first transducer means connected to receive said first electrical signal for producing vibration, a second transducer means for detecting vibration and producing a second electrical signal in response thereto, and means for comparing said first electrical signal and said second electrical signal with respect to at least one of harmonics, energy, voltage, duration, rise time and time delay.

19. Apparatus as recited in claim 18, wherein said first transducer means and said second transducer means are spaced from each other by a housing.

20. Apparatus as recited in claim 19, further including automated positioning means for positioning said housing to bring said first transducer into contact with one of an electrical component and a carrier to which said electrical component is attached by a solder connection and to bring said second transducer into contact with another of said electrical component and a carrier to which said electrical component is attached by a solder connection.

21. Apparatus as recited in claim 18, wherein said means for comparing includes a digital envelope processor.

22. Apparatus as recited in claim 18, wherein said calibrator means includes means for periodically varying amplitude of said first electrical signal.

\* \* \* \* \*